(12) United States Patent
Nam et al.

(10) Patent No.: US 9,595,812 B2
(45) Date of Patent: Mar. 14, 2017

(54) CROSSED NANOBEAM STRUCTURE FOR A LOW-THRESHOLD GERMANIUM LASER

(71) Applicant: The Board of Trustees of the Leland Stanford Junior University, Palo Alto, CA (US)

(72) Inventors: Donguk Nam, Mountain View, CA (US); Jan A. Petykiewicz, Stanford, CA (US); Devanand S. Sukhdeo, Jersey City, NJ (US); Shashank Gupta, Stanford, CA (US); Jelena Vuckovic, Palo Alto, CA (US); Krishna C. Saraswat, Saratoga, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 14/747,756

(22) Filed: Jun. 23, 2015

(65) Prior Publication Data
US 2015/0372455 A1    Dec. 24, 2015

Related U.S. Application Data

(60) Provisional application No. 62/015,798, filed on Jun. 23, 2014.

(51) Int. Cl.
*H01S 5/32* (2006.01)
*H01S 5/06* (2006.01)
*H01S 5/026* (2006.01)
*H01S 5/10* (2006.01)

(52) U.S. Cl.
CPC .......... *H01S 5/3223* (2013.01); *H01S 5/0607* (2013.01); *H01S 5/0261* (2013.01); *H01S 5/105* (2013.01)

(58) Field of Classification Search
CPC .... H01S 5/3223; H01S 5/0607; H01S 5/0261; H01S 5/105
See application file for complete search history.

(56) References Cited

U.S. PATENT DOCUMENTS

| 2010/0290217 A1* | 11/2010 | Anantram | B82Y 20/00 362/159 |
| 2012/0153260 A1* | 6/2012 | Kim | B82Y 40/00 257/14 |
| 2013/0039664 A1* | 2/2013 | Clifton | H01L 31/0352 398/200 |

OTHER PUBLICATIONS

Zhang et al., "Photonic crystal nanobeam lasers", 2010, arXiv.
Rivoire et al., "Multiply resonant high quality photonic crystal nanocavities", 2011, arXiv.

(Continued)

*Primary Examiner* — Armando Rodriguez
(74) *Attorney, Agent, or Firm* — Lumen Patent Firm

(57) ABSTRACT

A crossed nanobeam structure for strain engineering in semiconductor devices is provided. For example, such a structure can be used for a low-threshold germanium laser. While the photonic crystal nanobeam enables light confinement in a subwavelength volume with small optical loss, another crossing nanobeam induces high tensile strain in the small region where the optical mode is tightly confined. As maintaining a small optical loss and a high tensile strain reduces the required pumping for achieving net optical gain beyond cavity losses, this technique can be used to develop an extremely low-threshold Ge laser source. Moreover, the structure can be easily integrated into electronic and photonic circuits.

13 Claims, 14 Drawing Sheets

(56) References Cited

OTHER PUBLICATIONS

Camacho-Aguilera et al., "An electrically pumped germanium laser", May 2, 2012, pp. 11316-11320, Optics express v20n10.
Nam et al., "Study of carrier statistics in uniaxially strained Ge for a low-threshold Ge laser", Jul. 2014, IEEE JSTQE v20n4.
Sukhdeo et al., "Direct bandgap germanium-on-silicon inferred from 5.7% <100> uniaxial tensile strain", Jun. 2014, pp. A8-A13, Photon. Res. v2n3.
Wu et al, "Suspended GaN-based band-edge type photonic crystal nanobeam cavities", Jan. 2014, pp. 2317-2323, Optics Express v22n3.

* cited by examiner

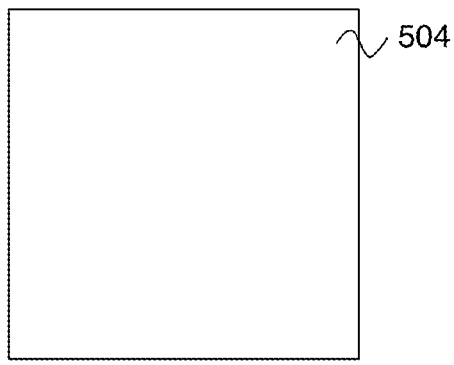
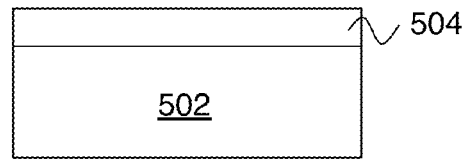
FIG. 5A  FIG. 5B
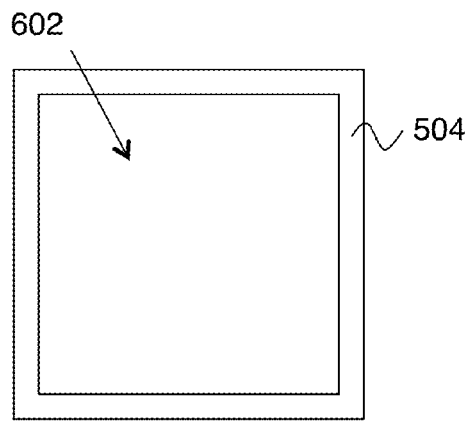
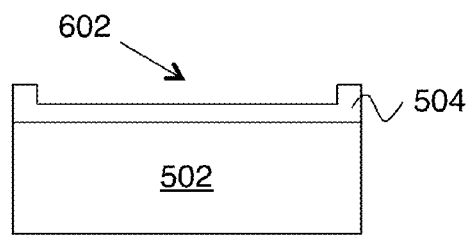
FIG. 6A  FIG. 6B

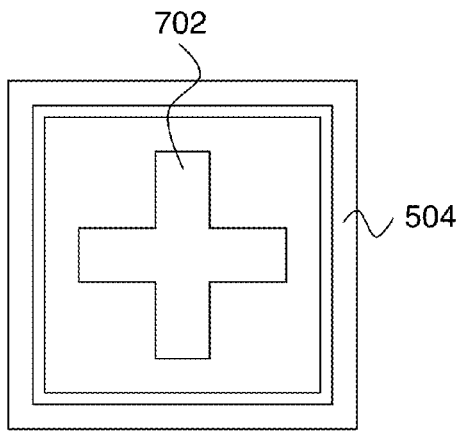 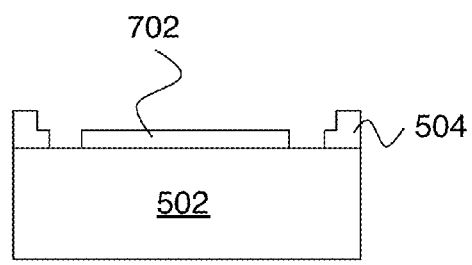
FIG. 7A                FIG. 7B
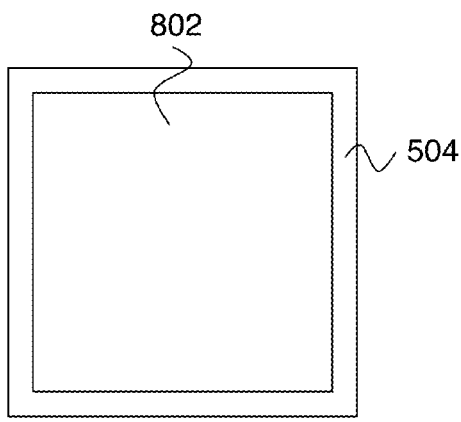 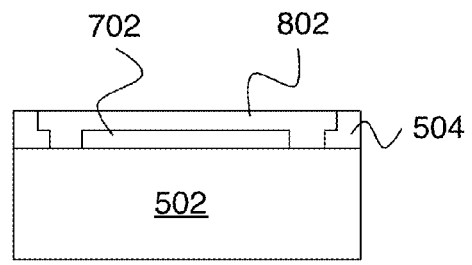
FIG. 8A                FIG. 8B

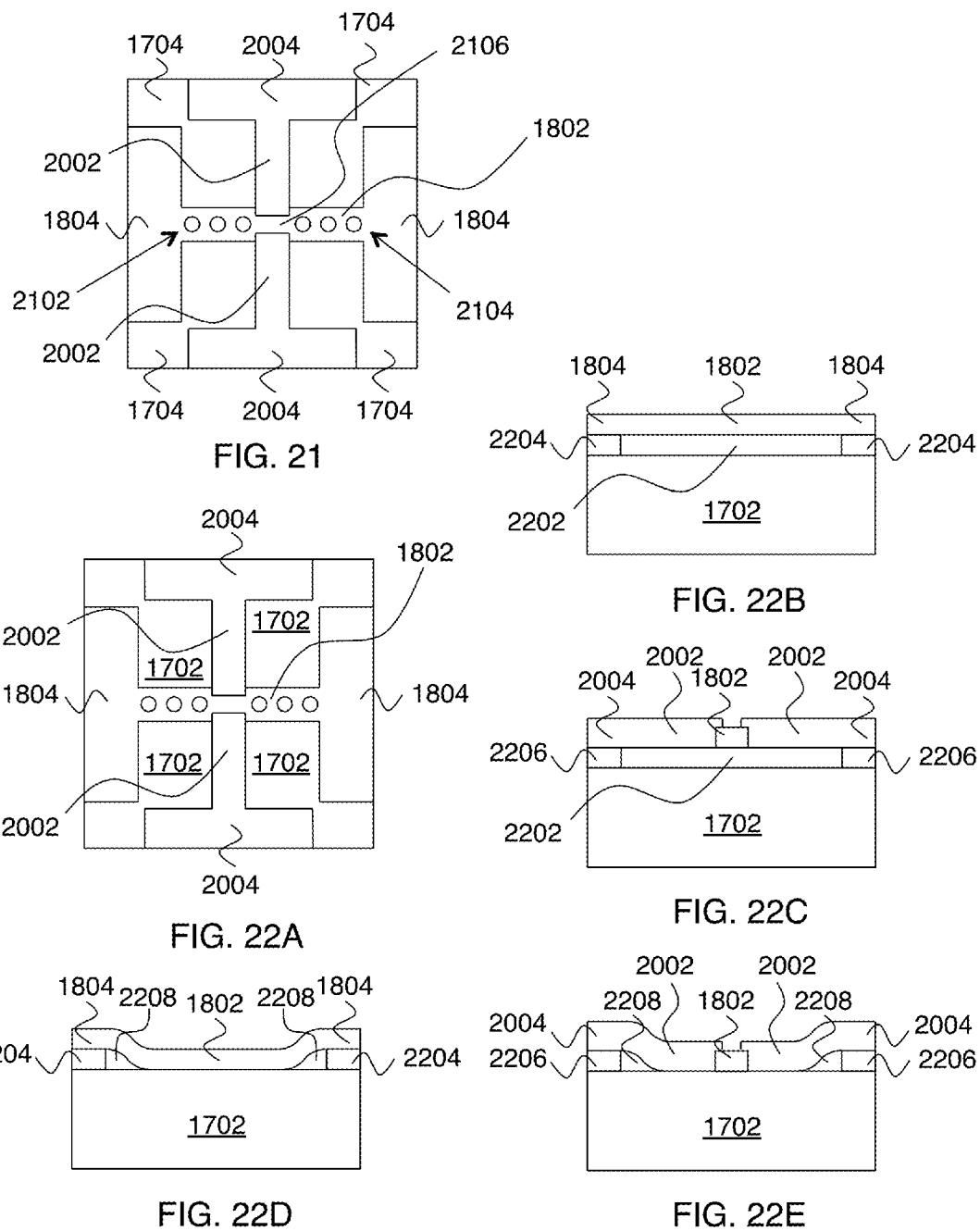

CROSSED NANOBEAM STRUCTURE FOR A LOW-THRESHOLD GERMANIUM LASER

CROSS REFERENCE TO RELATED APPLICATIONS

This application claims the benefit of U.S. provisional patent application 62/015,798, filed on Jun. 23, 2014, and hereby incorporated by reference in its entirety.

GOVERNMENT SPONSORSHIP

This invention was made with Government support under contract N00421-03-9-0002 awarded by the Department of the Navy and contract FA9550-09-1-0704 awarded by the Air Force Office of Scientific Research. The Government has certain rights in the invention.

FIELD OF THE INVENTION

This invention relates to semiconductor devices.

BACKGROUND

Strain has been employed in semiconductor device fabrication for some time. For example, growth of lattice mismatched layers on top of each other often gives rise to strained layers where the amount of strain is determined by the lattice mismatch. Such strain can be useful for altering the band structure of semiconductors (e.g., by increasing or decreasing the bandgap energy). More recently, some methods for application of mechanical strain to a semiconductor have been investigated in this context. Such methods can have the advantage of providing a variable amount of strain compared to the fixed strain provided by lattice mismatched growth. However, it remains difficult to provide a controlled level of strain to semiconductor structures, and it would be an advance in the art to facilitate such strain control.

SUMMARY

This work relates to a crossed beam structure for providing strain to the active region of a semiconductor device. For example, we consider a crossed nanobeam structure for a low-threshold germanium laser. It includes a germanium (Ge) photonic crystal nanobeam (i.e. a Ge nanobeam which contains a photonic crystal resonator) and a silicon nitride (SiN) stressor nanobeam in the perpendicular direction. While the photonic crystal nanobeam enables light confinement in a subwavelength volume with minimal optical loss, the SiN nanobeam induces high tensile strain in the small region where the optical mode is tightly confined. As maintaining a small optical loss and a high tensile strain reduces the required pumping for achieving net optical gain beyond cavity losses, this technique can be used to develop an extremely low-threshold Ge laser source.

Applications of this crossed beam structure include, but are not limited to: low-threshold Ge lasers, wavelength-tunable light sources, and wavelength-tunable modulators.

Significant advantages are provided. 1) The fabrication process can be compatible with conventional CMOS processing, as is the case for both an exemplary fabrication procedure and an alternative fabrication procedure described herein. 2) Tensile strain in the active gain medium can substantially reduce the lasing threshold current density of Ge lasers. For instance, a 1% tensile strain in the active gain medium can reduce the lasing threshold current density by a factor of 10-100 compared to existing Ge lasers, which provides significantly superior efficiency compared to existing technology. 3) The amount of strain in the active medium can be easily adjusted by the stressor geometry, enabling pre-fabrication wavelength tuning for different applications, such as mid-infrared lasers. Here strain is provided by the stress members, as opposed to using a lattice mismatch (as in conventional strained quantum wells). Thus the amount of strain provided can be adjusted to any desired value, as opposed to being determined by the lattice constants of the relevant materials.

This structure can be used for various electro-optic devices, such as modulators, by injecting carriers into the cavity region. Other types of materials can be used instead of Ge. This structure can be used with a III-V material (instead of Ge) to emit light at a different wavelength than is commonly accessible for the III-V material, since applying strain generally also changes bandgaps and emission wavelengths for III-V materials.

A Ge laser has been recently demonstrated in work by others, but the threshold current density (~280 kA/cm$^2$) was impractically high as a competitive laser source for on-chip and off-chip optical interconnects. This high threshold is mainly due to relatively high optical losses and the high level of pumping required to achieve net material gain in lightly-strained (~0.2%) Ge. As our highly strained photonic crystal nanobeam suffers from only minimal optical loss and also reduces the required pumping for the onset of material net gain, the threshold current density can be dramatically reduced compared to the existing Ge laser. In addition, our structure is fully CMOS-compatible while other studied approaches to achieve high strain in Ge (such as growing it on III-V materials, such as InGaAs, or straining it mechanically by externally applying pressure on the membrane) are incompatible with CMOS fabrication and integration.

An exemplary embodiment of the invention is a semiconductor structure including a semiconductor member configured as a first beam having an active region sandwiched between two side regions along its length. Two stress members are affixed to opposite lateral sides of the active region. The stress members are configured to provide mechanical tensile stress to the active region, such that the active region as a whole is subject to mechanical tensile strain.

The active region can include a semiconductor having a direct conduction band valley $CB_{dir}$ and an indirect conduction band valley $CB_{ind}$, where $CB_{dir}$ is higher in energy than $CB_{ind}$ by an energy difference of 250 meV or less with no applied strain, and where the energy difference decreases with mechanical tensile strain. Ge is an important example of such a semiconductor that tends to change from indirect-gap to direct-gap with application of tensile strain.

The mechanical strain can alter energy bandgaps in the semiconductor member such that a band profile of a double heterostructure is formed along the length of the semiconductor member.

Practice of the invention does not depend critically on the choice of material. Suitable materials for the active region include but are not limited to: III-V semiconductors, germanium, germanium-tin, silicon, silicon-germanium, and silicon-germanium-tin. Suitable materials for the stress members include, but are not limited to: silicon nitride, other dielectrics, and piezoelectric materials. Suitable materials or material combinations for the substrate include, but are not limited to: silicon, and silicon with a layer of silicon dioxide above it. Suitable materials for the sacrificial layer include, but are not limited to: silicon dioxide, aluminum oxide, and other dielectrics, with the condition that the sacrificial layer and the top surface of the substrate are composed of different materials. Suitable etchants for the sacrificial layer include, but are not limited to: hydrofluoric acid (HF) or buffered oxide etch (BOE) for the case where the top surface of the substrate is Si and the sacrificial layer is $SiO_2$, and potassium hydroxide (KOH) or tetramethylammonium hydroxide (TMAH) for the case where the top surface of the substrate is $SiO_2$ and the sacrificial layer is aluminum oxide.

In some embodiments, a $Si/SiO_2$ substrate (i.e. a substrate composed of Si with a layer of $SiO_2$ at the substrate's top surface) with an $Al_2O_3$ sacrificial layer which is ultimately etched in KOH is used, along with a Ge active region. The KOH selectively etches the $Al_2O_3$, while etching of the Ge and $SiO_2$ in KOH are relatively small or negligible. Although KOH is capable of efficiently etching silicon, the KOH and the Si are never in contact. Using an etchant such as TMAH instead of KOH can achieve a similar result. The material stack for this scenario is $Si/SiO_2/Al_2O_3/Ge$. The motivation for this material stack is that, if the Ge beam is adhered to the $Si/SiO_2$ substrate e.g. by stiction as described below, the $SiO_2$ at the substrate's top surface will provide sufficient refractive index contrast to the Ge beam that a large optical mode confinement is possible, while maintaining the thermal conduction advantages of having the Ge beam in direct contact with the substrate rather than being suspended.

The mechanical strain can be longitudinal and/or transverse with respect to the axis of the first beam. Here the axis of the beam is defined as running along its longest dimension. The stress members can be configured to form a second beam perpendicular to the first beam. Here the first and second beams can be suspended above a common substrate so as to provide, within the first beam, confinement of an optical mode in directions transverse to the axis of the first beam. Alternatively, the first and second beams can be deflected downward and permanently adhered to a top surface of the common substrate. By immersing the structure in a liquid during or after removal of the sacrificial layer (e.g. by removing the sacrificial layer with a wet etchant) the downward deflection may be achieved by capillary forces during the removal (e.g. evaporation) of the liquid and then permanently sustained by stiction without substantially affecting the strain transfer from the stress members to the first beam compared to the suspended case. Here stiction is defined as adhesion of two surfaces to each other via any combination of electrostatic forces, van der Waals forces and hydrogen bonding. By placing the first beam in contact with the top surface of the substrate, a shorter thermal conduction path is formed between the first beam and the substrate, thereby providing improved heat sinking compared to the suspended arrangement. Offsetting this benefit is reduced confinement of the optical mode within the first beam, though this deleterious effect can be minimized if the substrate's refractive index near the substrate's top surface is sufficiently smaller than the refractive index of the first beam (e.g., a refractive index ratio of 0.6 or less is typically preferred at this interface).

The side regions of the semiconductor member can include any features or structures helpful for device operation. For example, they can include photonic crystal reflectors as in the low-threshold Ge laser example considered below. Strained structures as described herein can be used in any optoelectronic semiconductor device, including but not limited to lasers, light emitting diodes, modulators, detectors and passive optical filters.

BRIEF DESCRIPTION OF THE DRAWINGS

FIGS. 5A-B show the starting point of a first exemplary fabrication procedure.

FIGS. 6A-B show the $SiO_2$ etch of the first exemplary fabrication procedure.

FIGS. 7A-B show the masked $SiO_2$ etch of the first exemplary fabrication procedure.

FIGS. 8A-B show the over lateral Ge growth step of the first exemplary fabrication procedure.

FIG. 21 shows the masked etch of photonic crystal holes in the Ge nanobeam of the second exemplary fabrication procedure of.

FIGS. 22A-E show the undercut etch and final device configuration of the second exemplary fabrication procedure.

DETAILED DESCRIPTION

Figure 1:
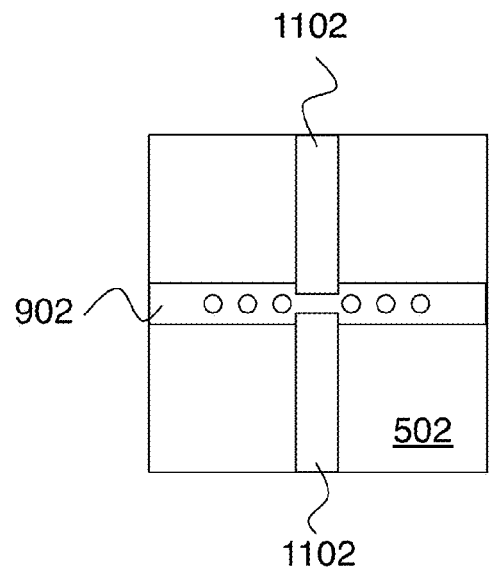
FIG. 1 shows a first crossed nanobeam structure for a low-threshold germanium laser.

We consider an example of a crossed nanobeam structure including a germanium (Ge) photonic crystal nanobeam and a silicon nitride (SiN) stressor nanobeam in the perpendicular direction for a low-threshold germanium laser. While a Ge photonic crystal nanobeam enables strong light confinement into a subwavelength volume using distributed Bragg reflectors along one axis, the SiN nanobeam in the other direction can induce a high tensile strain in the small region where the optical mode is tightly confined. Detailed simulations predict that the quality factor of this cavity can be high, and that the tensile strain in the region of our interest can be tunable by varying the length of the SiN beam. By taking advantage of both the small optical loss in the photonic crystal nanobeam and the reduced pumping needed to achieve net material gain within a highly strained active region, this structure opens up the possibility of an extremely low-threshold Si-compatible laser for on-chip and off-chip optical interconnects.

With the performance of on-chip and off-chip copper wires rapidly reaching performance limits due to continued transistor scaling, optical interconnects are becoming the strongest candidate to replace electrical interconnects for low latency, high bandwidth, and low power on-chip and off-chip communication, particularly for longer ("global") interconnects. In order to realize the integration of optical interconnects with silicon (Si) circuits, Ge has recently gained an increasing amount of interest because of its complete compatibility with conventional CMOS processes. Among all the components required for a complete optical link, a Ge light source is considered the greatest challenge due to its indirect band gap. Fortunately, however, the energy difference between the direct Γ valley and the indirect L valley is only 136 meV. Moreover, this difference can be reduced further by introducing tensile strain in Ge due to the different deformation potentials in the two valleys.

Recently, researchers from MIT have reported an electrically pumped Ge laser with heavily n-type doped Ge as the gain medium, fabricated directly on a silicon substrate. In their work, a Fabry-Perot cavity structure was employed, and the Ge gain medium was under 0.2% tensile strain which resulted from a thermal expansion mismatch between Ge and Si upon cooling from the high growth temperature to room temperature, since Ge and Si have different coefficients of thermal expansion. The threshold current density in their structure was 280 kA/cm$^2$. A laser with such a high threshold density is essentially impractical as a competitive laser source for on-chip and off-chip optical interconnects because metal contacts and transistors have very limited life time at such a high threshold current density level, and because the power required to pump above such a high threshold negates any advantage that optical interconnects might otherwise have. This high threshold is mainly due to relatively high optical losses and the high level of pumping required to achieve net material gain (i.e. net optical amplification within the Ge material). Optical losses come from several factors, such as facet losses and parasitic absorption in the electrical contacts. Moreover, lightly-strained (~0.2%) Ge requires very heavy pumping to achieve any net material gain at all, resulting in an even higher threshold current.

In order to realize a viable Ge laser source for an energy efficient optical link, it is important to reduce the threshold current density. This can be possible by achieving a better cavity design and simultaneously reducing the amount of pumping required for the onset of material net gain. Photonic crystal nanobeams have notably small optical mode volumes (~$(\lambda/n)^3$) and can exhibit moderate Q factors (>$10^4$) even when formed in cross-beam structures. They confine light by distributed Bragg reflection along their length and total internal reflection in their remaining dimensions. Tensile strain in Ge reduces the energy difference between the direct Γ valley and the indirect L valley, resulting in easier population inversion for direct band gap stimulated emission. In addition, strain breaks the degeneracy at the top of the valence bands by splitting the light-hole and heavy-hole bands. This reduces the density of states at the top of the valence band, and can reduce the lasing threshold even further. Thus, straining the active medium of high Q photonic crystal nanobeam is an important step in achieving a low-threshold Ge laser.

To achieve small optical losses and simultaneously reduce the pumping at the onset of net material gain, we provide a crossed nanobeam structure. One example of this approach is shown in FIG. 1. In this example, a nanobeam 902 is suspended above a silicon substrate 502. Stress is applied to nanobeam 902 via stress members 1102, which are also suspended above substrate 502.

To assess the advantages of this structure, we conducted optical and mechanical simulations. Finite-difference time domain (FDTD) simulation was used to evaluate optical properties. We designed nanobeams with 600-1000 nm widths, 220 nm thickness, and hole periodicities of 340-390 nm. Optical cavities were formed by creating a 5-hole linear taper defect at the center of the beam; the hole-to-hole spacing and radius were reduced linearly over five consecutive holes to 90% of their nominal values, then increased over five more holes to return to the nominal values. Ten periods of unaltered holes were positioned on either side of the defect. The designs were further optimized with FDTD simulations in order to obtain high quality factors. A typical set of design parameters follows: center-to-center hole spacing 363 nm, minimum spacing in defects 331 nm, hole radius 26% of center-to-center hole spacing, beam width 825 nm, beam thickness 220 nm, simulated resonance at 1650 nm wavelength.

Figure 2:
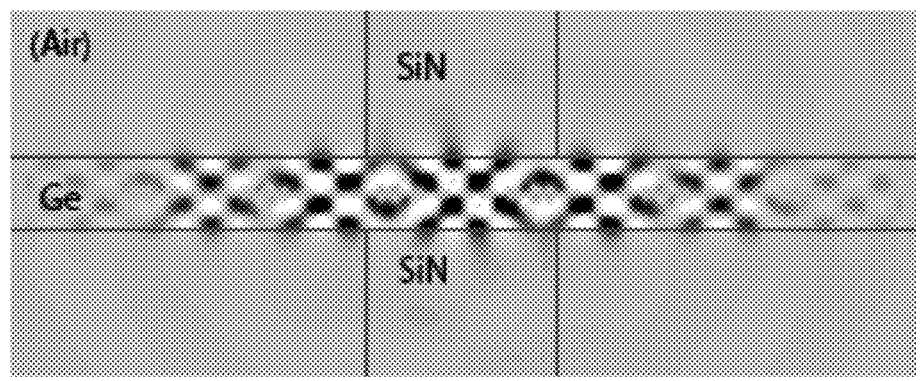
FIG. 2 shows the electric field distribution of the optical mode at the central plane of a simulated nanobeam structure. Etched air holes in the Ge beam are not shown but were included in the simulation. No material losses are included, and the effects of straining the Ge beam are not included. The design parameters for this simulation are stated in the text body.

FIG. 2 shows a plot of the in-plane transverse electric field at the central plane of such a beam with a 2 μm wide SiN cross-beam. The simulated radiative quality factor of the Ge/SiN crossbeam structure can exceed 2500 with minimal crossbeam design optimization; we expect that this value can be improved significantly by etching holes in the SiN crossbeam. Simulations of unstrained Ge-only structures exhibit quality factors in excess of 10,000.

Reducing the loss will allow lasing to occur at a reduced material gain, thus decreasing the pump power required for lasing. The optical mode volume in our un-optimized crossbeam structures is only ~1.22 $(\lambda/n)^3$. This small mode volume corresponds to the size of the active region of the device which needs to be under high strain.

Correspondingly, only this optically active region needs to be excited in order to achieve gain and lasing within the cavity; the large reduction in active volume over current state-of-the-art Ge devices is expected to significantly reduce the lasing threshold in our devices. Furthermore, the strong localization of light in nanobeam devices leads to Purcell enhancement of emission into the cavity mode, which can further decrease the laser threshold.

Figure 3:
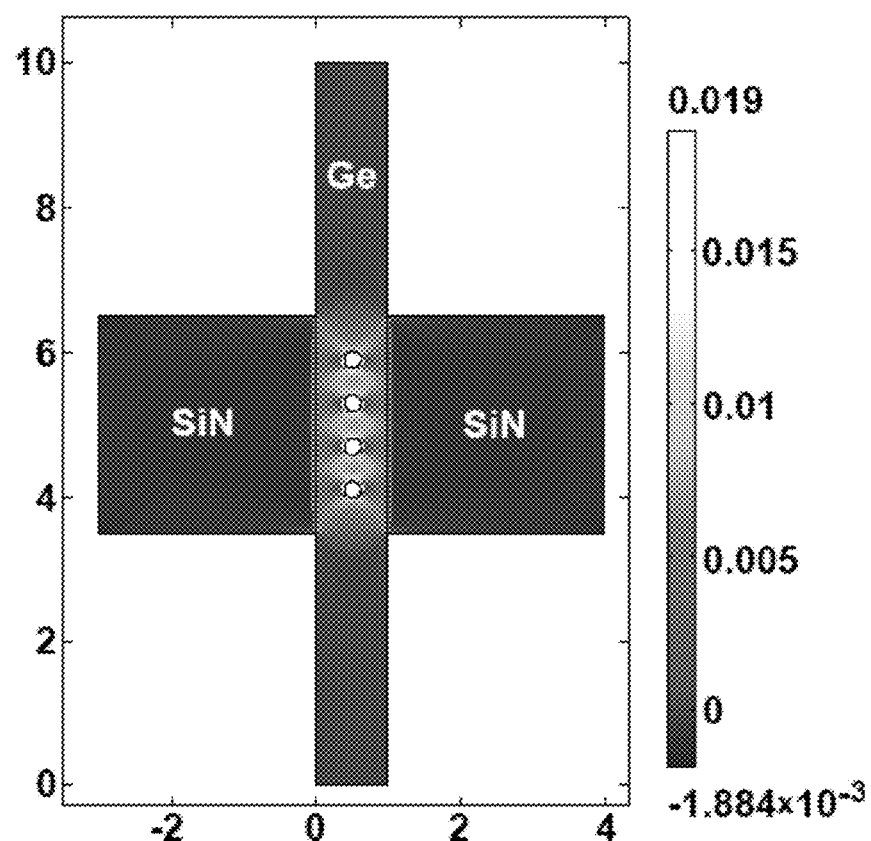
FIG. 3 shows the strain distribution at the central plane of a simulated nanobeam structure. Strain in-between holes is approximately 0.01 (1%). By increasing the SiN length, higher strain can be induced in Ge.

As higher tensile strain in Ge is expected to reduce the pumping required for net material gain, mechanical simulations were also conducted using finite element method (FEM) software to evaluate how much strain can be effectively induced in the active gain medium. When tensile stressed SiN is released from SiO$_2$, it shrinks in size and pulls the active region of Ge from the sides, inducing a large tensile strain in Ge. The strain value in the Ge gain medium can be tuned by the amount of stress in SiN and the releasing length of SiN. As shown in FIG. 3, strain in the active region can be as high as 1% with 3 μm released SiN of 1 GPa tensile stress. Notably, strain is higher in-between holes where the optical field intensity is at its maximum.

From an sp$^3$d$^5$s* tight-binding model and numerical simulations, the threshold current density for lasing is expected to reduce by orders of magnitude depending on the strain level in the active gain medium. This is important, since a threshold current below approximately 1 kA/cm$^2$ would make the Ge nanobeam laser competitive with current state-of-the-art III-V lasers, with the added advantage of silicon-compatibility.

Although the specific embodiment described here is using Ge and SiN materials, the idea is general. Other semiconductors and stressor materials can be used to emit light at a different wavelength. Substrates other than Si and sacrificial layers other than SiO$_2$ can also be used.

Figure 4:
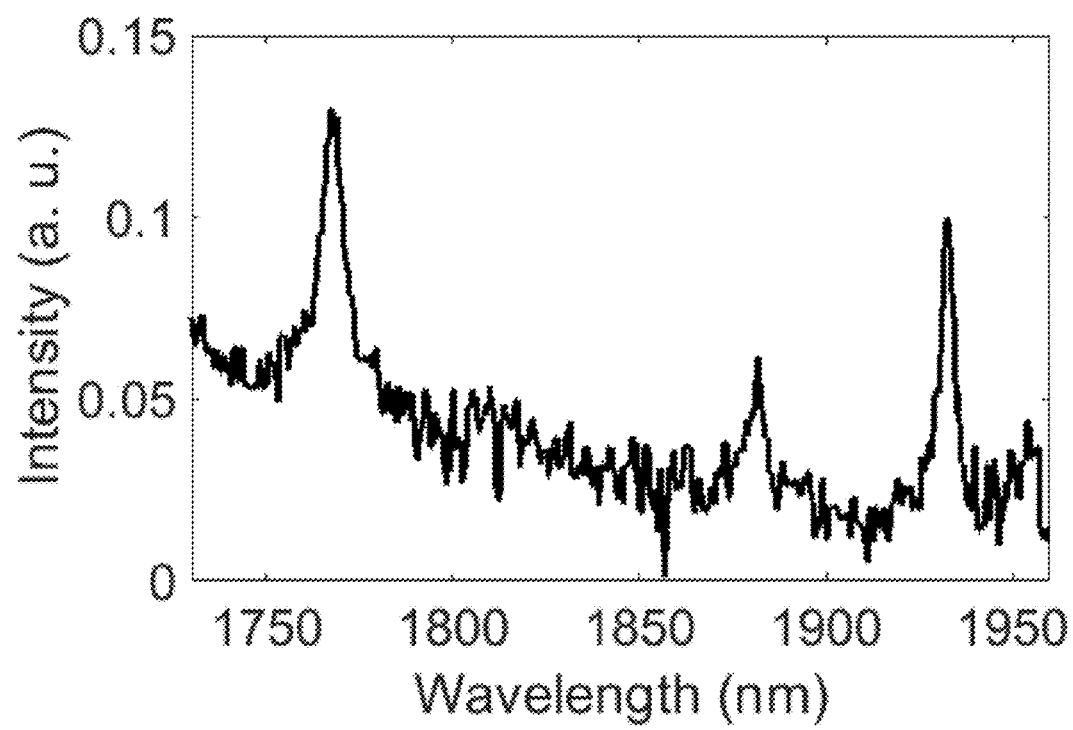
FIG. 4 is a measured photoluminescence spectrum.

FIG. 4 provides experimental validation of our cavity design by presenting a photoluminescence spectrum gathered by exciting a fabricated crossbeam structure, prior to the release step, with a 5 mW 980 nm laser and collecting the light emitted normal to the wafer surface. Three resonances with Lorentzian lineshapes are visible at wavelengths of 1767 nm, 1881 nm, and 1932 nm, with quality factors of approximately 250, 400, and 300 respectively. The quality factors observed are limited by fabrication imperfections in the initial fabrication run.

FIGS. 5A-14E show an exemplary fabrication procedure for making the structure of FIG. 1. FIGS. 5A-11A, FIG. 12 and FIGS. 13A-14A are top views. FIGS. 5B-11B, FIGS. 13B-14B and FIGS. 13D-14D are cross section views along a horizontal line through the center of the corresponding A figures. FIGS. 9C-11C, FIGS. 13C-14C and FIGS. 13E-14E are cross section views along a vertical line through the center of the corresponding A figures.

FIGS. 5A-B show the starting point of this example, where SiO$_2$ 504 is disposed on top of silicon 502.

FIGS. 6A-B show the result of a lithographically masked etch into the SiO$_2$ 504 to define a recess 602. The depth of recess 602 ends up defining the thickness of the Ge nanobeam.

FIGS. 7A-B show the result of another lithographically masked etch into the SiO$_2$ 504, this time to define a cross-shaped SiO$_2$ region 702. As will be seen later, the crossed nanobeams of interest are formed on top of cross-shaped region 702, and are later released from this structure by an undercut etch that selectively removes region 702. Preferably the widths of region 702 are slightly larger than the widths of the corresponding nanobeams and stress members.

FIGS. 8A-B show the result of depositing Ge 802 on the structure of FIGS. 7A-B., followed by chemical-mechanical polishing (CMP) to level the top surface of Ge 802 with the top of the unetched SiO$_2$ regions. As can be seen on FIG. 8B, this step combines with the etch of FIGS. 6A-B to define the thickness of the Ge nanobeam.

Figure 9A:
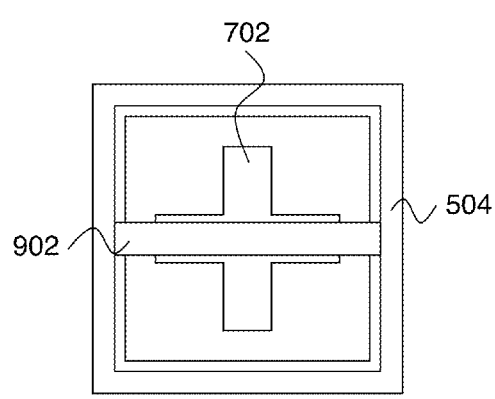
FIGS. 9A-C show the masked Ge etch of the first exemplary fabrication procedure.
Figure 9B:
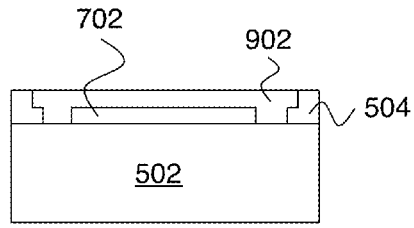
Figure 9C:
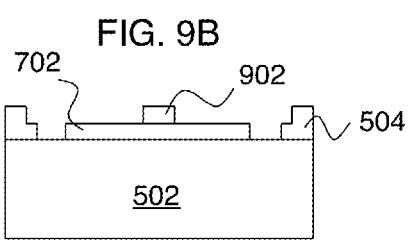

FIGS. 9A-C show the result of forming a nanobeam 902 with a masked etch of Ge 802.

Figure 10A:
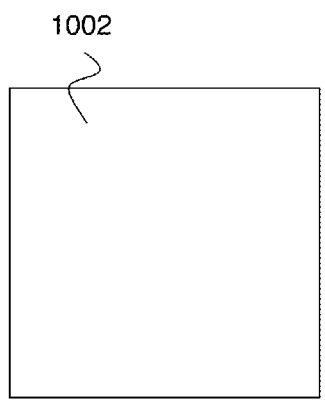
FIGS. 10A-C show the SiN deposition and planarization step of the first exemplary fabrication procedure.
Figure 10B:
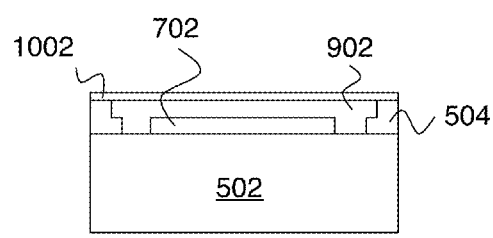
Figure 10C:
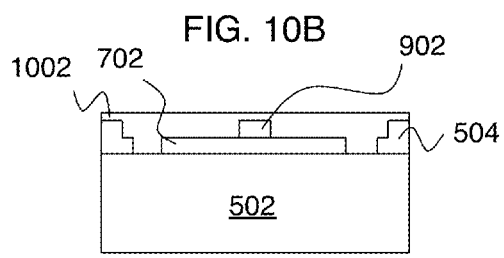

FIGS. 10A-C show the result of depositing SiN 1002 on the structure of FIGS. 9A-C followed by planarization by chemical mechanical polishing (CMP).

Figure 11A:
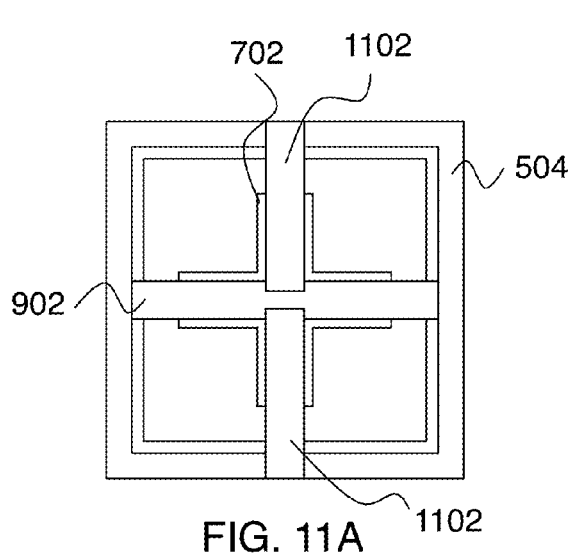
FIGS. 11A-C show masked SiN etch of the first exemplary fabrication procedure.
Figure 11B:
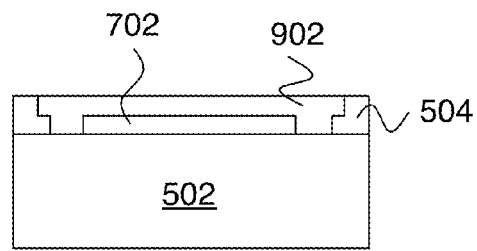
Figure 11C:
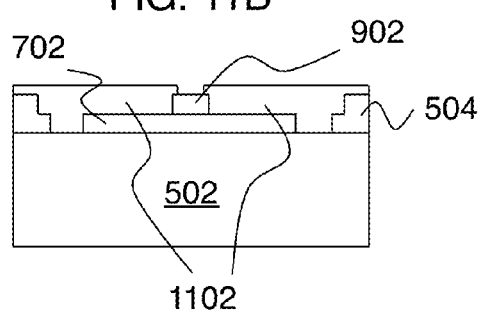

FIGS. 11A-C show the result of forming stress members 1102 with a masked etch of SiN 1002.

Figure 12:
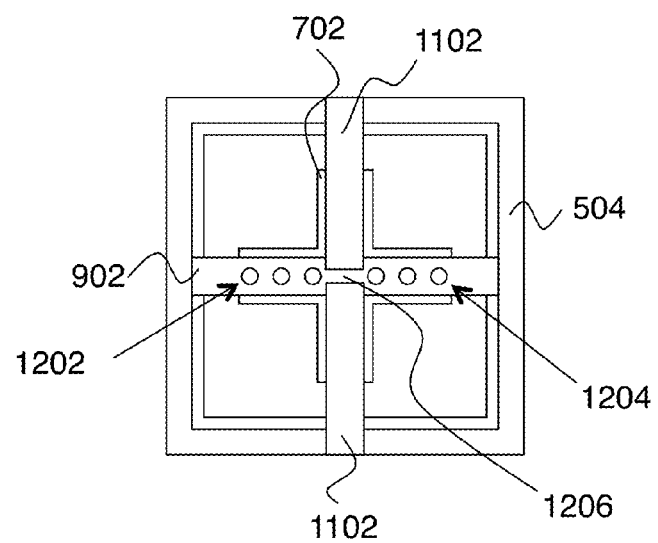
FIG. 12 shows the masked etch of photonic crystal holes in the Ge nanobeam of the first exemplary fabrication procedure.

FIG. 12 shows the results of a masked etch of holes in Ge nanobeam 902. Here an active region 1206 is sandwiched between photonic crystal reflector regions 1202 and 1204. In this example, active region 1206 is schematically shown as having a missing hole that acts as a defect in the photonic crystal to define the optical resonator, but any other kind of photonic crystal defect can also be used to define the optical resonator in the active region. For simplicity, the holes of this photonic crystal structure are not shown in the cross section view of FIGS. 13B and 14B. In cases where photonic crystal reflectors are employed, such reflectors are not limited to 1-D arrays of holes as in this example. Any periodic structure that provides a photonic bandgap can be employed. Here we define a "photonic crystal reflector" as any structure that reflects incident radiation due to a photonic bandgap.

Figure 13A:
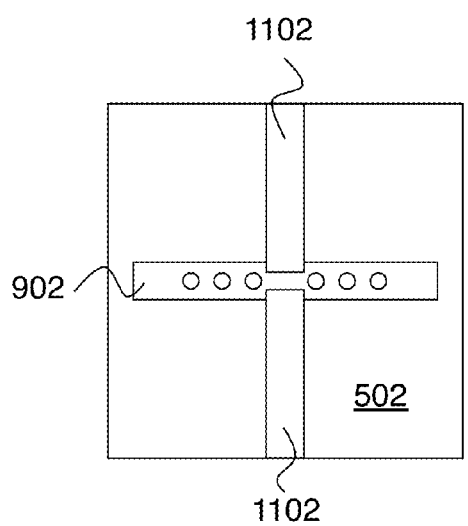
FIGS. 13A-E show the undercut etch of the first exemplary fabrication procedure.
Figure 13B:
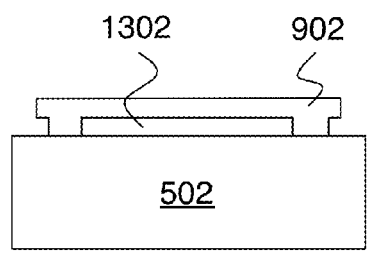
Figure 13C:
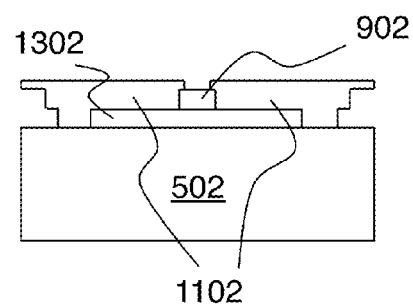

FIGS. 13A-E show the results of an isotropic etch of the SiO$_2$ sacrificial layer. This isotropic etch undercuts nanobeam 902 and stress members 1102 by selectively removing SiO$_2$ 702 and SiO$_2$ 504. This isotropic etch can be a stiction-free wet etch or a vapor etch, as depicted in FIGS. 13B-C. The resulting structure has nanobeam 902 and stress members 1102 suspended over silicon substrate 502 and separated from the substrate by an air gap 1302.

Figure 13D:
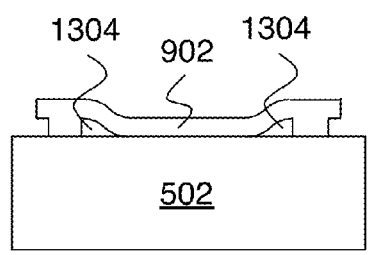
Figure 13E:
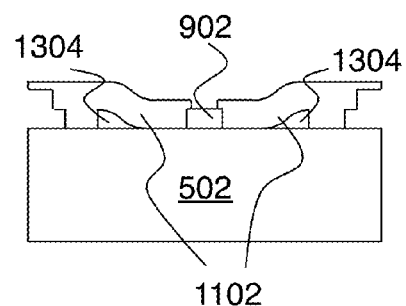

Alternatively, nanobeam 902 and stress members 1102 can be bonded to substrate 502 by stiction as depicted in FIGS. 13D-E. By removing SiO$_2$ sacrificial layer 702 by wet etching, capillary forces during evaporation of the wet etchant can bring the beams into contact with the substrate where they are then permanently adhered by stiction. The same result can be achieved by using a (isotropic) dry etch of the SiO$_2$ 702, and then immersing the entire structure in a liquid (water, isopropanol, etc.) where stiction occurs upon evaporation of the liquid. The resulting structure has nanobeam 902 and stress members 1102 deflected downward to be in contact with silicon substrate 502, with air gaps 1304 present only near the outer edges of nanobeam 902 and stress members 1102 where the deflections occur.

The presence or absence of stiction has no effect on the top view of the structure (FIG. 13A).

Figure 14A:
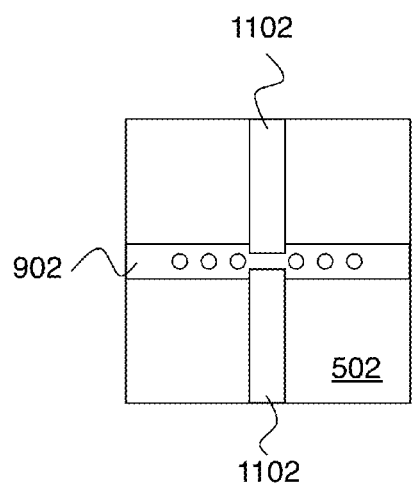
FIGS. 14A-E show the final device configuration in the first exemplary fabrication procedure.
Figure 14B:
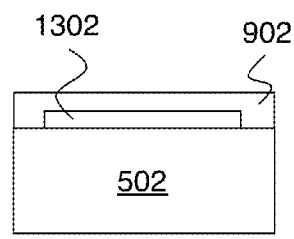
Figure 14C:
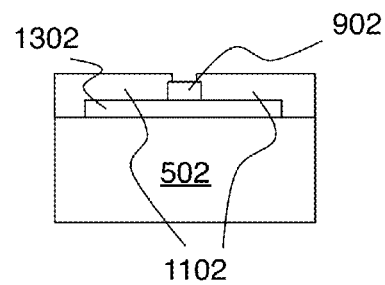
Figure 14D:
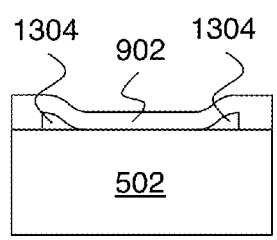
Figure 14E:
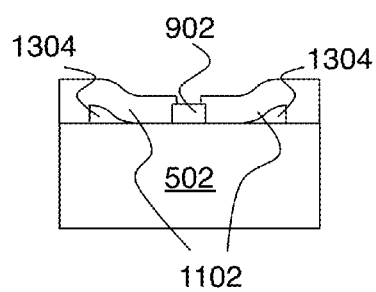

FIGS. 14A-E show the result of an optional step of laterally trimming the device as shown. FIGS. 14B-C depict the scenario where no stiction occurred in the SiO$_2$ etch of the previous step, whereas FIGS. 14D-E depict the scenario where stiction did occur in the SiO$_2$ etch of the previous step. The presence or absence of stiction has no effect on the top view of the structure (FIG. 14A).

This fabrication procedure can be summarized as having the following steps:

1) Fabricating a semiconductor member (902) configured as a first beam having an active region (1206) sandwiched between two side regions (1202 and 1204), where the semiconductor member is at least partially disposed on a sacrificial layer (702).

2) Fabricating two stress members (1102) affixed to opposite lateral surfaces of the active region and at least partially disposed on the sacrificial layer.

3) Selectively removing the sacrificial layer at least from beneath the active region in order to release the active region.

In the resulting structure, the stress members provide mechanical stress to the active region. Thus, the active region as a whole is subject to mechanical strain.

Figure 15:
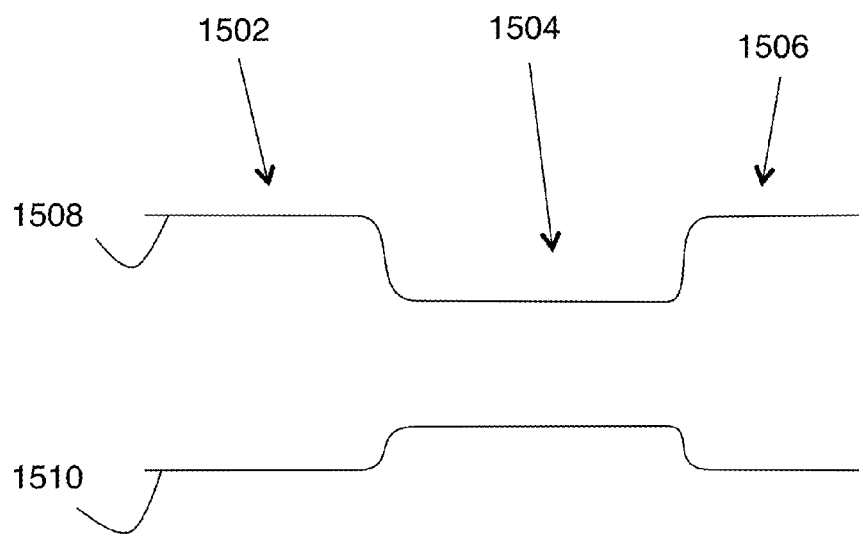
FIG. 15 shows an example of strain being used to form a band profile of a double heterostructure.

The flexible strain engineering provided by this crossed beam approach can enable a variety of strain engineering effects. For example, the band profile of a double heterostructure can be provided along the length of a nanobeam by straining the active region of the nanobeam. FIG. 15 shows an example where strain is applied (as described above) to an active region 1504 that is sandwiched between side regions 1502 and 1506. Assuming the applied strain tends to decrease the bandgap, the resulting band structure could be as schematically shown on FIG. 15, where the conduction band is referenced as 1508 and the valence band is referenced as 1510. The greatest strain is in the active region, with less or no strain in the side regions on either side of the active region. This can create the band profile of a double heterostructure along the length of the semiconductor member.

Figure 16:
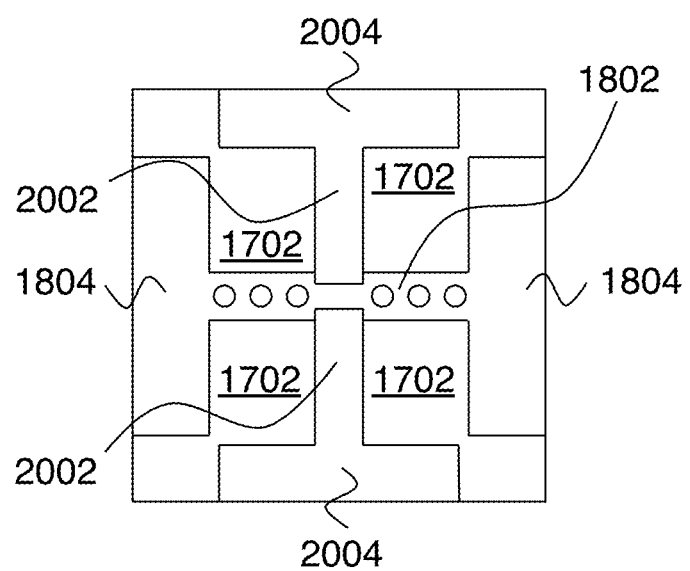
FIG. 16 shows a second crossed nanobeam structure for a low-threshold germanium laser.

Alternative fabrication approaches are possible that also have the basic steps described above of fabricating the semiconductor member, fabricating the stress members, and selectively removing a sacrificial layer to release the semiconductor member and stress members. For example, FIG. 16 shows an alternative crossed nanobeam structure where a Ge-on-insulator substrate is used instead of Ge over-lateral growth. In this example, Ge nanobeam 1802 is supported by Ge handles 1804. Similarly, SiN stress members 2002 are supported by SiN handles 2004. Nanobeam 1802 and stress members 2002 are suspended above substrate 1702.

FIGS. 17A-22E show an exemplary fabrication procedure for making the structure of FIG. 16. FIGS. 17A-20A, FIG. 21 and FIG. 22A are top views. FIGS. 17B-20B, FIG. 22B and FIG. 22D are cross section views along a horizontal line through the center of the corresponding A figures. FIGS. 18C-20C, FIG. 22C and FIG. 22E are cross section views along a vertical line through the center of the corresponding A figures.

Figure 17A:
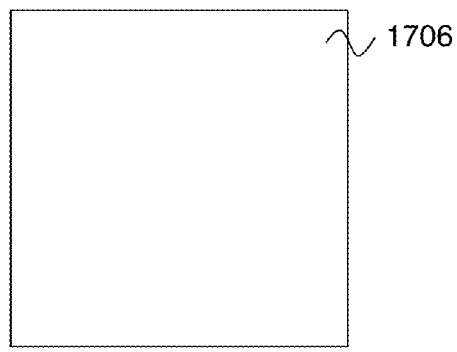
FIGS. 17A-B show the starting point of a second exemplary fabrication procedure.
Figure 17B:
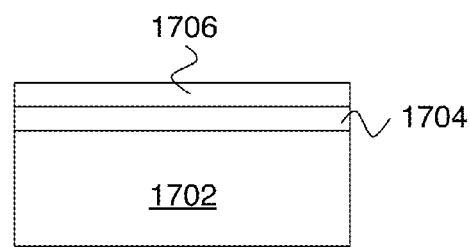

FIGS. 17A-B show the starting point of this example, where $SiO_2$ 1704 is disposed on top of silicon 1702, and Ge 1706 is disposed on top of $SiO_2$ 1704. The initial thickness of Ge 1706 will be the thickness of the Ge nanobeam.

Figure 18A:
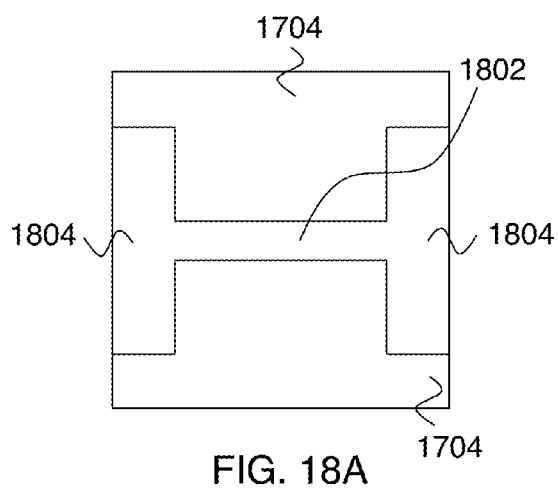
FIGS. 18A-C show the masked Ge etch of the second exemplary fabrication procedure.
Figure 18B:
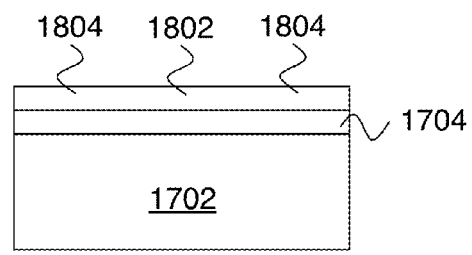
Figure 18C:
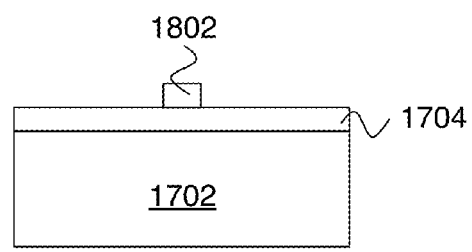

FIGS. 18A-C show the result of forming a nanobeam 1802 connected to Ge handles 1804 with a masked etch of Ge 1706.

Figure 19A:
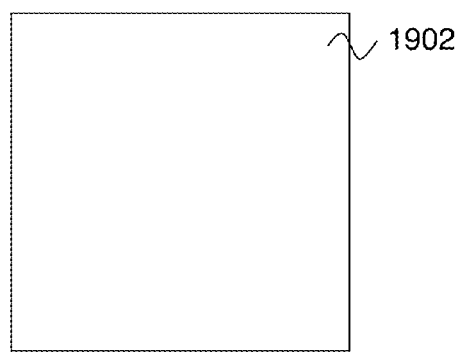
FIGS. 19A-C show the SiN deposition and planarization step of the second exemplary fabrication procedure.
Figure 19B:
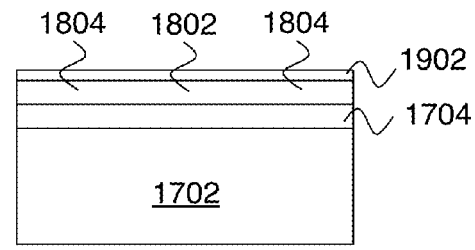
Figure 19C:
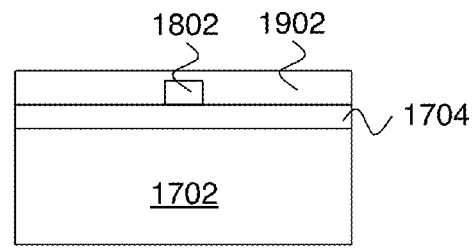

FIGS. 19A-C show the result of depositing SiN 1902 on the structure of FIGS. 18A-C followed by planarization by chemical mechanical polishing (CMP).

Figure 20A:
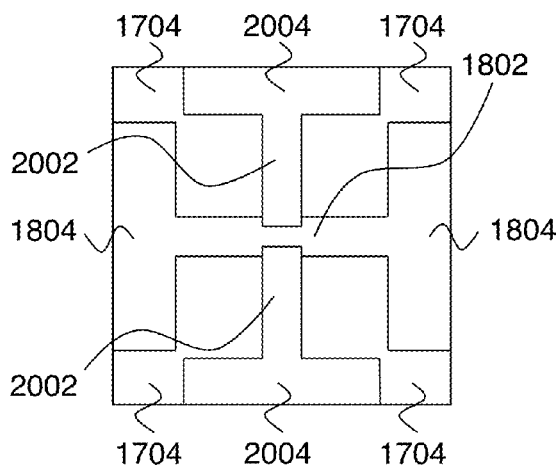
FIGS. 20A-C show masked SiN etch of the second exemplary fabrication procedure.
Figure 20B:
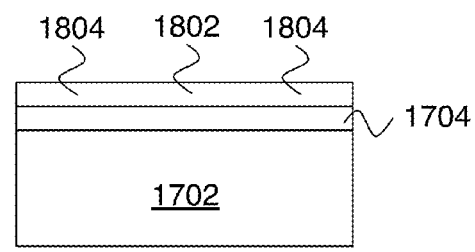
Figure 20C:
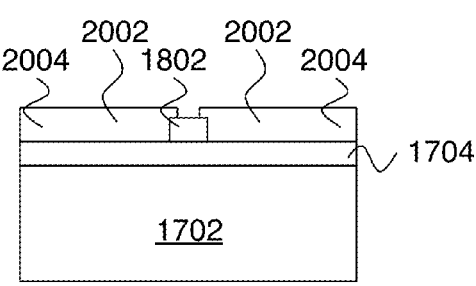

FIGS. 20A-C show the result of forming stress members 2002 connected to SiN handles 2004 with a masked etch of SiN 1902.

FIG. 21 shows the results of a masked etch of holes in Ge nanobeam 1802. Here an active region 2106 is sandwiched between photonic crystal reflector regions 2102 and 2104. In this example, active region 2106 is schematically shown as having a missing hole that acts as a defect in the photonic crystal to define the optical resonator, but any other kind of photonic crystal defect can also be used to define the optical resonator in the active region. For simplicity, the holes of this photonic crystal structure are not shown in the cross section view of FIG. 22B. In cases where photonic crystal reflectors are employed, such reflectors are not limited to 1-D arrays of holes as in this example. Any periodic structure that provides a photonic bandgap can be employed.

FIGS. 22A-E show the results of an isotropic etch of the $SiO_2$ sacrificial layer. This isotropic etch undercuts nanobeam 1802 and stress members 2002 by selectively removing $SiO_2$ 1704 beneath nanobeam 1802 and stress members 2002. Not all of $SiO_2$ 1704 is removed, however, with $SiO_2$ 2202 remaining beneath a portion of Ge handles 1804 and $SiO_2$ 2204 remaining beneath a portion of SiN handles 2004. $SiO_2$ 2202 and $SiO_2$ 2204 ensure that Ge handles 1804 and SiN handles 2004, respectively, remain physically connected to the substrate.

The isotropic etch of this step can be a stiction-free wet etch or a vapor etch, as depicted in FIGS. 22B-C. The resulting structure has nanobeam 1802 and stress members 2002 suspended over silicon substrate 1702 and separated from the substrate by an air gap 2202.

Alternatively, nanobeam 1802 and stress members 2002 can be bonded to substrate 1702 by stiction as depicted in FIGS. 22D-E. By removing the relevant portions of $SiO_2$ sacrificial layer 1704 by wet etching, capillary forces during evaporation of the wet etchant can bring the beams into contact with the substrate where they are then permanently adhered by stiction. The same result can be achieved by using a (isotropic) dry etch of $SiO_2$ 1704, and then immersing the entire structure in a liquid (water, isopropanol, etc.) where stiction occurs upon evaporation of the liquid. The resulting structure has nanobeam 1802 and stress members 2002 deflected downward to be in contact with silicon substrate 1702, with air gaps 2208 present only near the outer edges of nanobeam 1802 and stress members 2002 where the deflections occur. Not all of $SiO_2$ 1704 is removed during this etch, with $SiO_2$ 2202 remaining beneath a portion of Ge handles 1804 and $SiO_2$ 2204 remaining beneath a portion of SiN handles 2004. $SiO_2$ 2202 and $SiO_2$ 2204 ensure that Ge handles 1804 and SiN handles 2004, respectively, remain physically connected to the substrate.

The presence or absence of stiction has no effect on the top view of the structure (FIG. 22A).

The invention claimed is:

1. A semiconductor structure comprising:
   a semiconductor member configured as a first beam having an active region sandwiched between two side regions along its length; and
   two stress members affixed to opposite lateral surfaces of the active region;
   wherein the stress members are configured to provide mechanical stress to the active region, whereby the active region as a whole is subject to mechanical strain;
   wherein the stress members are configured to form a second beam perpendicular to the first beam.

2. The structure of claim 1, wherein the active region comprises a semiconductor having a direct conduction band valley $CB_{dir}$ and an indirect conduction band valley $CB_{ind}$, wherein $CB_{dir}$ is higher in energy than $CB_{ind}$ by an energy difference of 250 meV or less with no applied strain, and wherein the energy difference decreases with mechanical tensile strain.

3. The structure of claim 2, wherein the semiconductor is germanium.

4. The structure of claim 1, wherein the mechanical strain alters energy bandgaps in the semiconductor member such that a band profile of a double heterostructure is formed along the length of the semiconductor member.

5. The structure of claim 1, wherein the active region comprises a semiconductor selected from the group consisting of: III-V semiconductors, germanium, germanium-tin, silicon, silicon-germanium, and silicon-germanium-tin.

6. The structure of claim 1, wherein the stress members comprise material selected from the group consisting of: silicon nitride, dielectrics and piezo-electric materials.

7. The structure of claim 1, wherein the mechanical strain is transverse with respect to an axis of the first beam.

8. The structure of claim 1, wherein the mechanical strain is tensile strain.

9. The structure of claim 1, wherein the active region is suspended above a substrate.

10. The structure of claim 1, wherein the active region is affixed to a substrate.

11. The structure of claim 10, wherein the active region is affixed to the substrate by stiction.

12. A semiconductor laser including the structure of claim 1, wherein the side regions include photonic crystal reflectors.

13. An optoelectronic semiconductor device including the structure of claim 1, wherein the optoelectronic semiconductor device is selected from the group consisting of: lasers, light emitting diodes, modulators, detectors and passive optical filters.

* * * * *